(12) United States Patent
Kang

(10) Patent No.: US 11,381,210 B2
(45) Date of Patent: Jul. 5, 2022

(54) AMPLIFIER, AND RECEIVING CIRCUIT, SEMICONDUCTOR APPARATUS AND SEMICONDUCTOR SYSTEM INCLUDING THE AMPLIFIER

(71) Applicant: SK hynix Inc., Icheon-si (KR)

(72) Inventor: Ji Hyo Kang, Seongnam-si Gyeonggi-do (KR)

(73) Assignee: SK hynix Inc., Icheon-si (KR)

( * ) Notice: Subject to any disclaimer, the term of this patent is extended or adjusted under 35 U.S.C. 154(b) by 125 days.

(21) Appl. No.: 16/598,639

(22) Filed: Oct. 10, 2019

(65) Prior Publication Data

US 2020/0266787 A1 Aug. 20, 2020

(30) Foreign Application Priority Data

Feb. 18, 2019 (KR) .......................... 10-2019-0018503

(51) Int. Cl.
*H03F 3/45* (2006.01)
*H03G 3/30* (2006.01)
*H03F 3/16* (2006.01)

(52) U.S. Cl.
CPC ............ *H03G 3/3052* (2013.01); *H03F 3/16* (2013.01); *H03F 3/45179* (2013.01); *H03F 2200/267* (2013.01); *H03F 2200/375* (2013.01); *H03F 2203/45212* (2013.01); *H03F 2203/45354* (2013.01); *H03F 2203/45701* (2013.01); *H03G 2201/103* (2013.01)

(58) Field of Classification Search
CPC .. H03G 3/3052; H03G 2201/103; H03G 5/28; H03F 3/45179; H03F 3/16; H03F 2200/375; H03F 2203/45354; H03F 2200/267; H03F 2203/45212; H03F 2203/45701; H03F 3/45744; H03F 2203/45318; H03F 2203/45364; H03F 2203/45702; H03F 2203/45492; H03F 2203/45494; H03F 2203/45488; H03F 3/45197
USPC ................................ 330/253, 254, 302, 277
See application file for complete search history.

(56) References Cited

U.S. PATENT DOCUMENTS

| | | | | |
|---|---|---|---|---|
| 4,146,844 A | * | 3/1979 | Quinn | ........................ H03F 1/32 330/149 |
| 6,188,280 B1 | * | 2/2001 | Filip | ...................... H03F 1/3211 330/252 |
| 6,369,658 B1 | * | 4/2002 | Nilson | ................ H03F 3/45098 330/252 |
| 7,245,181 B2 | * | 7/2007 | Sanduleanu | .............. H03F 1/08 330/124 R |
| 2012/0049897 A1 | | 3/2012 | Kubo | |

* cited by examiner

*Primary Examiner* — Khanh V Nguyen
*Assistant Examiner* — Khiem D Nguyen
(74) *Attorney, Agent, or Firm* — William Park & Associates Ltd.

(57) ABSTRACT

An amplifier includes a first input circuit, a second input circuit, a first compensation circuit, a second compensation circuit. The first input circuit changes a voltage level of the negative output node based on a first input signal. The second input circuit changes a voltage level of the positive output node based on a second input signal. The first compensation circuit changes the voltage level of the positive output node based on the first input signal. The second compensation circuit changes the voltage level of the negative output node based on the second output signal.

21 Claims, 7 Drawing Sheets

FIG.2
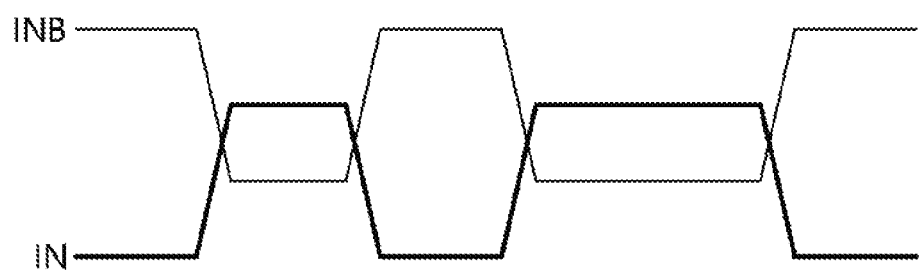
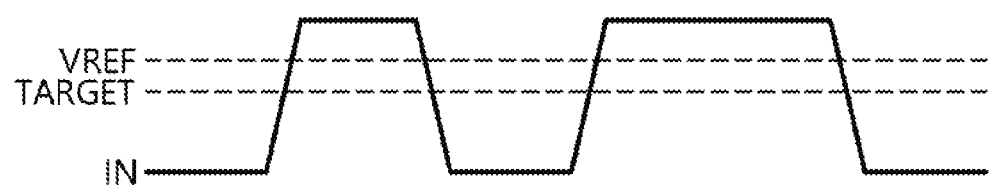
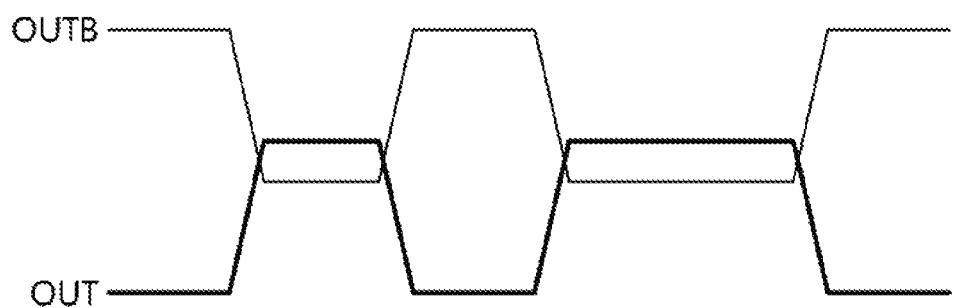

AMPLIFIER, AND RECEIVING CIRCUIT, SEMICONDUCTOR APPARATUS AND SEMICONDUCTOR SYSTEM INCLUDING THE AMPLIFIER

CROSS-REFERENCES TO RELATED APPLICATION

The present application claims priority under 35 U.S.C. § 119(a) to Korean application number 10-2019-0018503, filed on Feb. 18, 2019, in the Korean Intellectual Property Office, which is incorporated herein by reference in its entirety.

BACKGROUND

1. Technical Field

Various embodiments generally relate to an integrated circuit technology, and more particularly, to a semiconductor apparatus and a semiconductor system.

2. Related Art

An electronic device may include many electronic components. Among the electronic components, a computer system may include a large number of semiconductor apparatuses composed of semiconductors. The semiconductor apparatuses constituting the computer system may communicate with one another while transmitting and receiving clock signals and data. Each of the semiconductor apparatuses may include a receiving circuit to receive a signal transmitted from an external device or receive a signal transmitted between internal circuits in the semiconductor apparatus. The receiving circuit may include an amplifier, and the amplifier may perform a differential amplification operation to receive the transmitted signal. The amplifier may receive differential signals or a single ended signal. The amplifier uses a reference voltage to receive the single ended signal. When the receiving circuit receives differential signals, the amplifier may generate an output signal by differentially amplifying an input signal pair inputted as the differential signals. When the receiving circuit receives the single ended signal, the amplifier may generate an output signal by differentially amplifying the single ended signal as one input signal and the reference voltage. However, when a DC offset is present between the differential signals or an offset is preset between the single ended signal and the reference voltage, the quality of the output signal outputted from the amplifier may be degraded. In particular, the offset of the input signal may degrade the duty characteristic of the output signal, thereby degrading the duty ratio of the output signal.

SUMMARY

In an embodiment, an amplifier may include a first input circuit, a second input circuit, a first compensation circuit, a second compensation circuit, and a source resistor. The first input circuit may be coupled between a negative output node coupled to a first supply voltage terminal and a first common node coupled to a second supply voltage terminal, and configured to change a voltage level of the negative output node based on a first input signal. The second input circuit may be coupled between a positive output node coupled to the first supply voltage terminal and a second common node coupled to the second supply voltage terminal, and configured to change a voltage level of the positive output node based on a second input signal. The first compensation circuit may be coupled between the positive output node and the first common node, and configured to change the voltage level of the positive output node based on the first input signal. The second compensation circuit may be coupled between the negative output node and the second common node, and configured to change the voltage level of the negative output node based on the second input signal. The source resistor may be coupled between the first and second common nodes.

In an embodiment, an amplifier may include a first input circuit, a second input circuit, a first delay circuit, a second delay circuit, a third input circuit, a fourth input circuit, and an equalization circuit. The first input circuit may be coupled between a negative output node coupled to a first supply voltage terminal and a first common node coupled to a second supply voltage terminal, and configured to change a voltage level of the negative output node based on a first input signal. The second input circuit may be coupled between a positive output node coupled to the first supply voltage terminal and a second common node coupled to the second supply voltage terminal, and configured to change a voltage level of the positive output node based on a second input signal. The first delay circuit may be configured to generate a first delayed input signal by delaying the first input signal. The second delay circuit may be configured to generate a second delayed input signal by delaying the second input signal. The third input circuit may be coupled between the positive output node and the first common node, and configured to change the voltage level of the positive output node based on the first delayed input signal. The fourth input circuit may be coupled between the negative output node and the second common node, and configured to change the voltage level of the negative output node based on the second delayed input signal. The equalization circuit may be coupled between the first and second common nodes.

BRIEF DESCRIPTION OF THE DRAWINGS

FIG. 2 is a diagram illustrating an operation of an amplifier which does not include first and second compensation circuits of FIG. 1.

DETAILED DESCRIPTION

Figure 1:
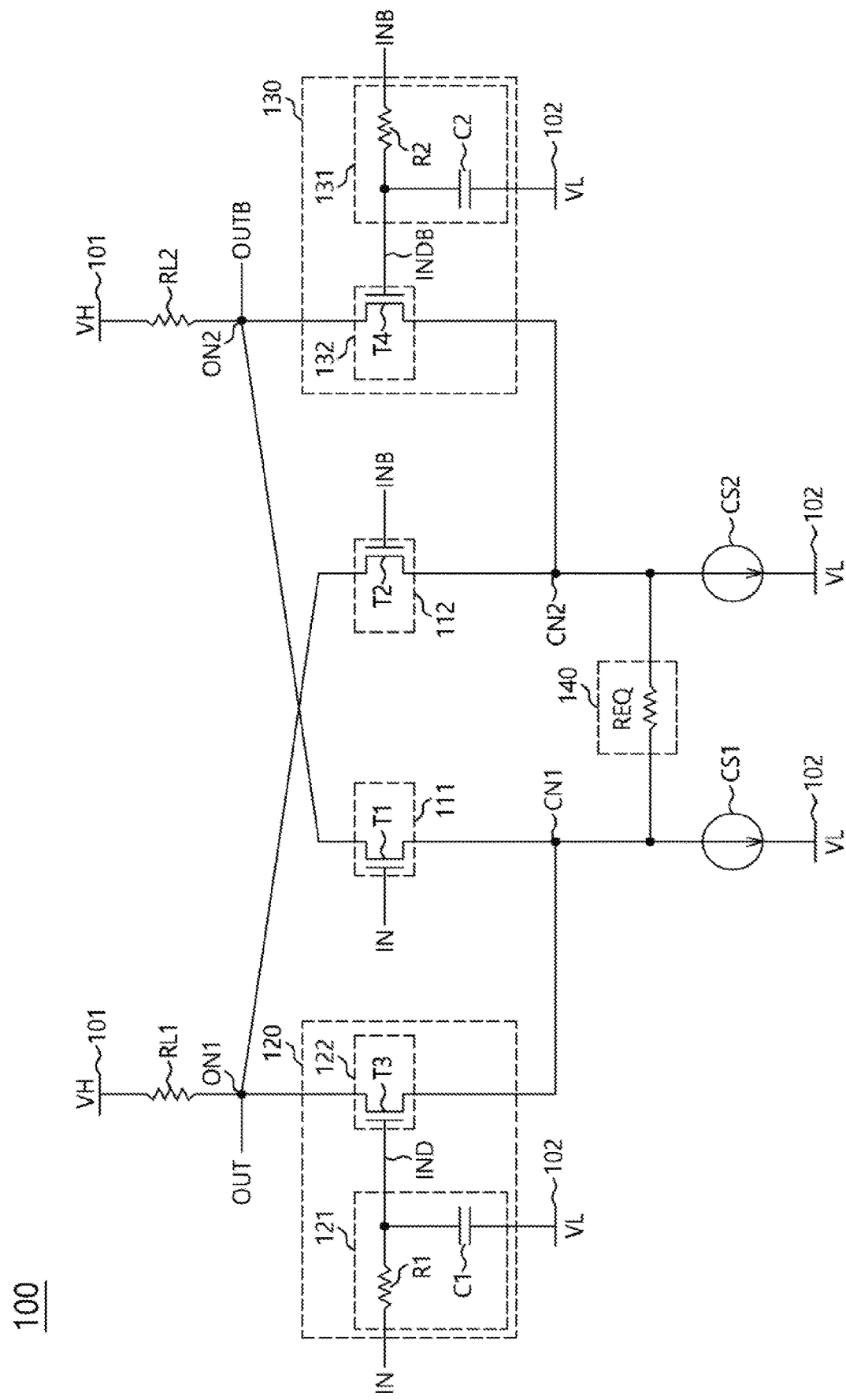
FIG. 1 is a diagram illustrating a configuration of an amplifier in accordance with an embodiment.

FIG. 1 is a diagram illustrating a configuration of an amplifier 100 in accordance with an embodiment. The amplifier 100 may receive a first input signal IN and a second input signal INB, and generate a primary output signal OUT and a secondary output signal OUTB. The amplifier 100 may generate the primary output signal OUT and the secondary output signal OUTB by differentially amplifying the first and second input signals IN and INB. The amplifier 100 may receive differential signals or a single ended signal. When the amplifier 100 receives the differential signals, the second input signal INB may be a complementary signal having a complementary voltage level to the first input signal IN. When the amplifier 100 receives a single ended signal, the second input signal INB may serve as a reference voltage. The reference voltage may have a voltage level corresponding to the middle of the range in which the first input signal IN swings.

The amplifier 100 may include a first input circuit 111, a second input circuit 112, a first compensation circuit 120, a second compensation circuit 130 and an equalization circuit 140. The first input circuit 111 may be coupled between a negative output node ON2 and a first common node CN1. The negative output node ON2 may be coupled to a first supply voltage terminal 101, and the secondary output signal OUTB may be outputted through the negative output node ON2. The first common node CN1 may be coupled to a second supply voltage terminal 102. The first supply voltage terminal 101 may receive a first supply voltage VH, and the second supply voltage terminal 102 may receive a second supply voltage VL. The first supply voltage VH may have a higher voltage level than the second supply voltage VL. For example, the first supply voltage VH may be an operating supply voltage of a semiconductor apparatus including the amplifier 100, and the second supply voltage VL may be a ground voltage. The first input circuit 111 may receive the first input signal IN, and change the voltage level of the negative output node ON2 based on the first input signal IN.

The second input circuit 112 may be coupled between a positive output node ON1 and a second common node CN2. The positive output node ON1 may be coupled to the first supply voltage terminal 101, and the primary output signal OUT may be outputted through the positive output node ON1. The second input circuit 112 may receive the second input signal INB, and change the voltage level of the positive output node ON1 based on the second input signal INB.

The first compensation circuit 120 may be coupled between the positive output node ON1 and the first common node CN1. The first compensation circuit 120 may receive the first input signal IN, and change the voltage level of the positive output node ON1 based on the first input signal IN. The first compensation circuit 120 may delay the first input signal IN, and change the voltage level of the positive output node ON1 based on the delayed signal.

The second compensation circuit 130 may be coupled between the negative output node ON2 and the second common node CN2. The second compensation circuit 130 may receive the second input signal INB, and change the voltage level of the negative output node ON2 based on the second input signal INB. The second compensation circuit 130 may delay the second input signal INB, and change the voltage level of the negative output node ON2 based on the delayed signal.

The equalization circuit 140 may be coupled between the first and second common nodes CN1 and CN2. The equalization circuit 140 may couple the first and second common nodes CN1 and CN2 to equalize the voltage levels of the first and second common nodes CN1 and CN2. The equalization circuit 140 may adjust a gain of the amplifier 100. For example, the equalization circuit 140 may adjust a DC gain and an AC gain of the amplifier 100. The DC gain, which is a gain of the amplifier when an input signal having a relatively low frequency is received, may indicate a gain of the amplifier 100 when the first input signal IN retains a steady-state voltage level. The AC gain, which is a gain of the amplifier when an input signal having a relatively high frequency is received, may indicate a gain of the amplifier 100 when the voltage level of the first input signal IN transitions.

In FIG. 1, the amplifier 100 may further include a first load resistor RL1 and a second load resistor RL2. The first load resistor RL1 may be coupled between the first supply voltage terminal 101 and the positive output node ON1. The second load resistor RL2 may be coupled between the first supply voltage terminal 101 and the negative output node ON2. A resistance of the second load resistor RL2 may be substantially same with a resistance of the first load resistor RL1. In an embodiment, the resistance of the second load resistor RL2 may be different from the resistance of the first load resistor RL1. The amplifier 100 may further include a first current source CS1 and a second current source CS2. The first current source CS1 may be coupled between the first common node CN1 and the second supply voltage terminal 102. The second current source CS2 may be coupled between the second common node CN2 and the second supply voltage terminal 102. A current amount of the second current source CS2 may be substantially same with a current amount of the first current source CS1. In an embodiment, the current amount of the second current source CS2 may be different from the current amount of the first current source CS1.

The first input circuit 111 may include a first transistor T1. The first transistor T1 may be an N-channel MOS transistor. The first transistor T1 may have a gate configured to receive the first input signal IN, a drain coupled to the negative output node ON2, and a source coupled to the first common node CN1. The second input circuit 112 may include a second transistor T2. The second transistor T2 may be an N-channel MOS transistor. The second transistor T2 may have a gate configured to receive the second input signal INB, a drain coupled to the positive output node ON1, and a source coupled to the second common node CN2.

The first compensation circuit 120 may include a first delay circuit 121 and a third input circuit 122. The first delay circuit 121 may receive the first input signal IN, and generate a first delayed input signal IND by delaying the first input signal IN. The third input circuit 122 may be coupled between the positive output node ON1 and the first common node CN1. The third input circuit 122 may receive the first delayed input signal IND from the first delay circuit 121. The third input circuit 122 may change the voltage level of the positive output node ON1 based on the first delayed input signal IND.

The first delay circuit 121 may include a first resistor R1 and a first capacitor C1. The first input signal IN may be inputted to one end of the first resistor R1, and the first delayed input signal IND may be outputted from the other end of the first resistor R1. The first capacitor C1 may be coupled between the other end of the first resistor R1 and the second supply voltage terminal 102. The first delay circuit 121 may generate the first delayed input signal IND of which the phase lags behind the first input signal IN and the amplitude is reduced more than the first input signal IN, using an RC (Resistive-Capacitive) delay configured by the first resistor R1 and the first capacitor C1.

The third input circuit 122 may include a third transistor T3. The third transistor T3 may be an N-channel MOS transistor. The third transistor T3 may have a gate configured to receive the first delayed input signal IND, a drain coupled to the positive output node ON1, and a source coupled to the first common node CN1. The amplifier 100 may include the first compensation circuit 120 to change the voltage level of the positive output node ON1 based on the second input signal INB and the first delayed input signal IND generated from the first input signal IN which is a complementary signal to the second input signal INB.

The second compensation circuit 130 may include a second delay circuit 131 and a fourth input circuit 132. The second delay circuit 131 may receive the second input signal INB, and generate a second delayed input signal INDB by delaying the second input signal INB. The fourth input circuit 132 may be coupled between the negative output node ON2 and the second common node CN2. The fourth input circuit 132 may receive the second delayed input signal INDB from the second delay circuit 131. The fourth input circuit 132 may change the voltage level of the negative output node ON2 based on the second delayed input signal INDB.

The second delay circuit 131 may include a second resistor R2 and a second capacitor C2. The second input signal INB may be inputted to one end of the second resistor R2, and the second delayed input signal INDB may be outputted from the other end of the second resistor R2. The second capacitor C2 may be coupled between the other end of the second resistor R2 and the second supply voltage terminal 102. The second delay circuit 131 may generate the second delayed input signal INDB of which the phase lags behind the second input signal INB and the amplitude is reduced more than the second input signal INB, using an RC delay configured by the second resistor R2 and the second capacitor C2.

The fourth input circuit 132 may include a fourth transistor T4. The fourth transistor T4 may be an N-channel MOS transistor. The fourth transistor T4 may have a gate configured to receive the second delayed input signal INDB, a drain coupled to the negative output node ON2, and a source coupled to the second common node CN2. The amplifier 100 may include the second compensation circuit 130 to change the voltage level of the negative output node ON2 based on the first input signal IN and the second delayed input signal INDB generated from the second input signal INB which is a complementary signal to the first input signal IN. The second resistor R2 may have substantially the same resistance value as the first resistor R1. The second capacitor C2 may have substantially the same capacitance as the first capacitor C1.

The equalization circuit 140 may include a source resistor REQ. The source resistor REQ may have one end coupled to the first common node CN1 and the other end coupled to the second common node CN2. The gain of the amplifier 100 may be changed according to the resistance value of the source resistor REQ. The source resistor REQ may have a different resistance value from the first and second resistors R1 and R2. In an embodiment, a source capacitor may be coupled between the first and second common nodes CN1 and CN2.

Figure 3:
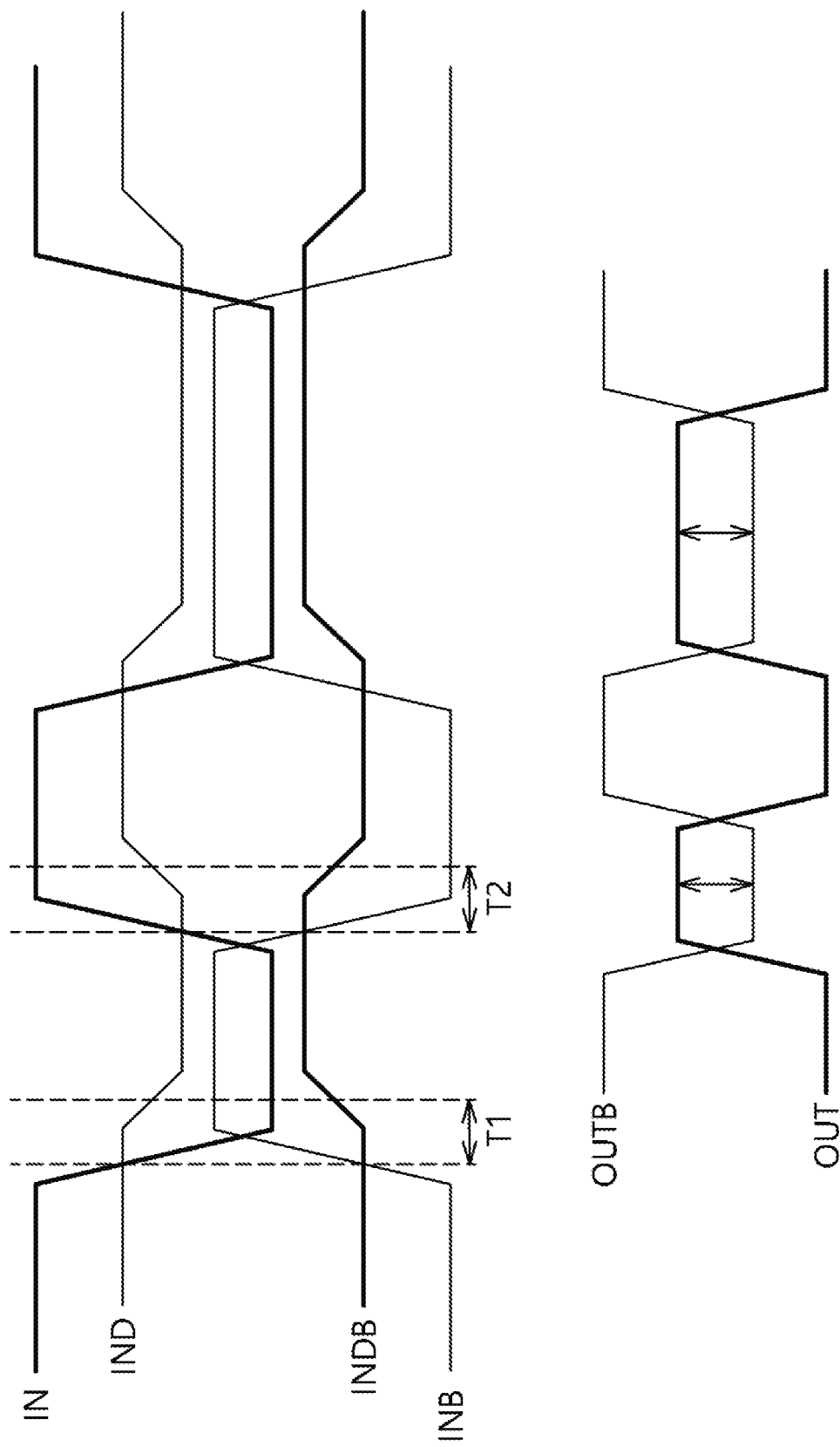
FIG. 3 is a diagram illustrating an operation of the amplifier in accordance with an embodiment.

FIG. 2 illustrates an operation of an amplifier which does not include the first and second compensation circuits 120 and 130 of FIG. 1, and FIG. 3 illustrates an operation of the amplifier 100 in accordance with a present embodiment. As illustrated in FIG. 2, when a DC offset is present between the first and second input signals IN and INB transmitted as differential signals, the voltage level of the first input signal IN in a high-level steady state may be lower than the voltage level of the second input signal INB in a high-level steady state, and the voltage level of the second input signal INB in a low-level steady state may be higher than the voltage level of the first input signal IN in a low-level steady state. When an offset is present between the first input signal IN transmitted as a single ended signal and the reference voltage VREF inputted as the second input signal INB, the reference voltage VREF may have a higher voltage level than a target level TARGET. On the other hand, the reference voltage VREF may have a lower voltage level than the target level TARGET. At this time, a difference between the voltage levels of the primary output signal OUT in a high-level steady state and the secondary output signal OUTB in a low-level steady state, generated through the amplifier which does not include the first and second compensation circuits 120 and 130, may be significantly reduced. Therefore, the valid duration, valid window or valid eye of the high-level interval of the primary output signal OUT may be reduced, and the duty ratio of the high-level interval to the low-level interval in the primary output signal OUT may be degraded.

As illustrated in FIG. 3, the amplifier 100 in accordance with a present embodiment may change the voltage level of the negative output node ON2 based on the first input signal IN and the second delayed input signal INDB, and change the voltage level of the positive output node ON1 based on the second input signal INB and the first delayed input signal IND. When the first input signal IN transitions from a high level to a low level, the second input signal INB may transition from a low level to a high level. The first delay circuit 121 may delay the first input signal IN, and output the first delayed input signal IND of which the phase lags behind the first input signal IN and the amplitude is reduced more than the first input signal IN. The second delay circuit 131 may delay the second input signal INB, and output the second delayed input signal INDB of which the phase lags behind the second input signal INB and the amplitude is reduced more than the second input signal INB.

At T1, when the second input signal INB transitions from a low level to a high level, the first input signal IN may transition from a high level to a low level. The second input circuit 112 may change the positive output node ON1 to the voltage level of the second supply voltage VL based on the second input signal INB. At this time, the high-level steady state of the first delayed input signal IND generated by delaying the first input signal IN may be retained until the second input signal INB transitions to the high level. The third input circuit 122 may accelerate the change in voltage level of the positive output node ON1 to the voltage level of the second supply voltage VL, based on the first delayed input signal IND. Therefore, the positive output node ON1 may be more quickly changed to the voltage level of the second supply voltage VL, and the voltage level of the primary output signal OUT may be boosted to a low level. The first input circuit 111 may change the negative output node ON2 to the voltage level of the first supply voltage VH based on the first input signal IN. At this time, the low-level steady state of the second delayed input signal INDB generated by delaying the second input signal INB may be retained until the first input signal IN transitions to the low level. The fourth input circuit 132 may accelerate the change in voltage level of the negative output node ON2 to the voltage level of the first supply voltage VH, based on the second delayed input signal INDB. Therefore, the negative output node ON2 may be more quickly changed to the voltage level of the first supply voltage VH, and the voltage level of the secondary output signal OUTB may be boosted to a high level. As the primary output signal OUT is boosted to the low level and the secondary output signal OUTB is boosted to the high level, a difference between the voltage level of the primary output signal OUT in the high-level steady state and the voltage level of the secondary output signal OUTB in the low-level steady state may become larger than that illustrated in FIG. 2, and the valid duration of the high-level interval of the primary output signal OUT may be increased or extended. Furthermore, the duty ratio of the high-level interval to the low-level interval in the primary output signal OUT may be improved.

At T2, when the first input signal IN transitions from a low level to a high level, the second input signal INB may transition from a high level to a low level. The first input circuit 111 may change the negative output node ON2 to the voltage level of the second supply voltage VL based on the first input signal IN. At this time, the high-level steady state of the second delayed input signal INDB may be retained until the first input signal IN transitions to a high level. Therefore, the fourth input circuit 132 may accelerate the change in voltage level of the negative output node ON2 to the voltage level of the second supply voltage VL, based on the second delayed input signal INDB. The negative output node ON2 may be more quickly changed to the voltage level of the second supply voltage VL, and the voltage level of the secondary output signal OUTB may be boosted to a low level. The second input circuit 112 may change the voltage level of the positive output node ON1 to the voltage level of the first supply voltage VH based on the second input signal INB. At this time, the low-level steady state of the first delayed input signal IND may be retained until the second input signal INB transitions to the low level. Therefore, the third input circuit 122 may accelerate the change in voltage level of the positive output node ON1 to the voltage level of the first supply voltage VH, based on the first delayed input signal IND. The positive output node ON1 may be more quickly changed to the voltage level of the first supply voltage VH, and the voltage level of the primary output signal OUT may be boosted to a high level. As the secondary output signal OUTB is boosted to the low level and the primary output signal OUT is boosted to the high level, a difference between the voltage level of the primary output signal OUT in the high-level steady state and the voltage level of the secondary output signal OUTB in the low-level steady state may become larger than that illustrated in FIG. 2, and the valid duration of the low-level interval of the primary output signal OUT may be increased or extended.

Figure 4:
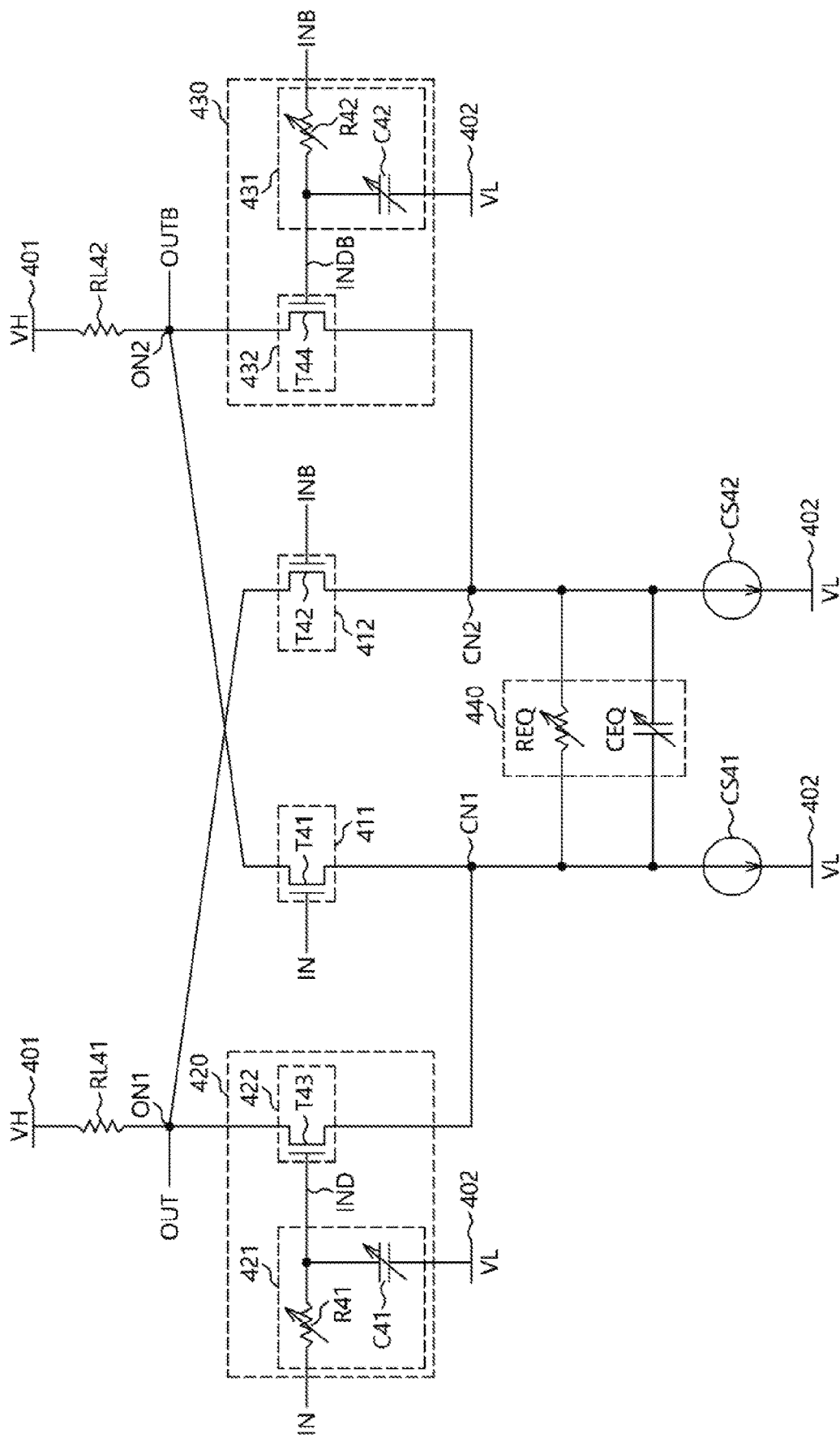
FIG. 4 is a diagram illustrating a configuration of an amplifier in accordance with an embodiment.

FIG. 4 illustrates a configuration of an amplifier 400 in accordance with an embodiment. The amplifier 400 may receive a first input signal IN and a second input signal INB, and generate a primary output signal OUT and a secondary output signal OUTB. The amplifier 400 may include a first input circuit 411, a second input circuit 412, a first compensation circuit 420, a second compensation circuit 430 and an equalization circuit 440. The first input circuit 411 may be coupled between a negative output node ON2 and a first common node CN1. The negative output node ON2 may be coupled to a first supply voltage terminal 401, and the secondary output signal OUTB may be outputted through the negative output node ON2. The first common node CN1 may be coupled to a second supply voltage terminal 402. The first supply voltage terminal 401 may receive a first supply voltage VH, and the second supply voltage terminal 402 may receive a second supply voltage VL.

The second input circuit 412 may be coupled between a positive output node ON1 and a second common node CN2. The positive output node ON1 may be coupled to the first supply voltage terminal 401, and the primary output signal OUT may be outputted through the positive output node ON1. The second input circuit 412 may receive the second input signal INB, and change the voltage level of the positive output node ON1 based on the second input signal INB.

The first compensation circuit 420 may be coupled between the positive output node ON1 and the first common node CN1. The first compensation circuit 420 may receive the first input signal IN, and change the voltage level of the positive output node ON1 based on the first input signal IN. The first compensation circuit 420 may delay the first input signal IN, and change the voltage level of the positive output node ON1 based on the delayed signal. The first compensation circuit 420 may have variable impedance, and change a zero point or an AC gain of the amplifier 400 according to an impedance change. The AC gain of the amplifier 400, which is a gain of the amplifier 400 in a specific frequency region where inductive peaking occurs, may indicate a gain of the amplifier 400, which is obtained when the voltage levels of the first and second input signals IN and INB transition. The zero point may indicate a frequency at a point of time that the inductive peaking occurs.

The second compensation circuit 430 may be coupled between the negative output node ON2 and the second common node CN2. The second compensation circuit 430 may receive the second input signal INB, and change the voltage level of the negative output node ON2 based on the second input signal INB. The second compensation circuit 430 may delay the second input signal INB, and change the voltage level of the negative output node ON2 based on the delayed signal. The first compensation circuit 420 may have variable impedance, and change the zero point or the AC gain of the amplifier 400 according to an impedance change.

The equalization circuit 440 may be coupled between the first and second common nodes CN1 and CN2. The equalization circuit 440 may couple the first and second common nodes CN1 and CN2 to equalize the voltage levels of the first and second common nodes CN1 and CN2. The equalization circuit 440 may adjust a gain of the amplifier 400. For example, the equalization circuit 440 may have variable impedance, and change a DC gain and the AC gain of the amplifier 400 according to an impedance change. The DC gain, which is a gain of the amplifier 400 when an input signal having a relatively low frequency is received, may indicate a gain of the amplifier 400, which is obtained when the first and second input signals IN and INB retain the steady-state voltage levels.

In FIG. 4, the amplifier 400 may further include a first load resistor RL41 and a second load resistor RL42. The first load resistor RL41 may be coupled between the first supply voltage terminal 401 and the positive output node ON1. The second load resistor RL42 may be coupled between the first supply voltage terminal 401 and the negative output node ON2. A resistance of the second load resistor RL42 may be substantially same with a resistance of the first load resistor RL41. In an embodiment, the resistance of the second load resistor RL42 may be different from the resistance of the first load resistor RL41. The amplifier 400 may further include a first current source CS41 and a second current source CS42. The first current source CS41 may be coupled between the first common node CN1 and the second supply voltage terminal 402. The second current source CS42 may be coupled between the second common node CN2 and the second supply voltage terminal 402. A current amount of the second current source CS42 may be substantially same with a current amount of the first current source CS41. In an embodiment, the current amount of the second current source CS42 may be different from the current amount of the first current source CS41.

The first input circuit 411 may include a first transistor T41. The first transistor T41 may be an N-channel MOS transistor. The first transistor T41 may have a gate configured to receive the first input signal IN, a drain coupled to the negative output node ON2, and a source coupled to the first common node CN1. The second input circuit 412 may include a second transistor T42. The second transistor T42 may be an N-channel MOS transistor. The second transistor T42 may have a gate configured to receive the second input signal INB, a drain coupled to the positive output node ON1, and a source coupled to the second common node CN2.

The first compensation circuit 420 may include a first delay circuit 421 and a third input circuit 422. The first delay circuit 421 may receive the first input signal IN, and generate a first delayed input signal IND by variably delaying the first input signal IN. The third input circuit 422 may be coupled between the positive output node ON1 and the first common node CN1. The third input circuit 422 may receive the first delayed input signal IND from the first delay circuit 421. The third input circuit 422 may change the voltage level of the positive output node ON1 based on the first delayed input signal IND.

The first delay circuit 421 may include a first variable resistor R41 and a first variable capacitor C41. The first input signal IN may be inputted to one end of the first variable resistor R41, and the first delayed input signal IND may be outputted from the other end of the first variable resistor R41. The first variable capacitor C41 may be coupled between the other end of the first variable resistor R41 and the second supply voltage terminal 402. The first delay circuit 421 may generate the first delayed input signal IND of which the phase lags behind the first input signal IN and the amplitude is reduced more than the first input signal IN, using a variable RC delay configured by the first variable resistor R41 and the first variable capacitor C41. The third input circuit 422 may include a third transistor T43. The third transistor T43 may be an N-channel MOS transistor. The third transistor T43 may have a gate configured to receive the first delayed input signal IND, a drain coupled to the positive output node ON1, and a source coupled to the first common node CN1. The amplifier 400 may include the first compensation circuit 420 to change the voltage level of the positive output node ON1 based on the second input signal INB and the first delayed input signal IND generated from the first input signal IN which is a complementary signal to the second input signal INB.

The second compensation circuit 430 may include a second delay circuit 431 and a fourth input circuit 432. The second delay circuit 431 may receive the second input signal INB, and generate a second delayed input signal INDB by variably delaying the second input signal INB. The fourth input circuit 432 may be coupled between the negative output node ON2 and the second common node CN2. The fourth input circuit 432 may receive the second delayed input signal INDB from the second delay circuit 431. The fourth input circuit 432 may change the voltage level of the negative output node ON2 based on the second delayed input signal INDB.

The second delay circuit 431 may include a second variable resistor R42 and a second variable capacitor C42. The second input signal INB may be inputted to one end of the second variable resistor R42, and the second delayed input signal INDB may be outputted from the other end of the second variable resistor R42. The second variable capacitor C42 may be coupled between the other end of the second variable resistor R42 and the second supply voltage terminal 402. The second delay circuit 431 may generate the second delayed input signal INDB of which the phase lags behind the second input signal INB and the amplitude is reduced more than the second input signal INB, using a variable RC delay configured by the second variable resistor R42 and the second variable capacitor C42. The fourth input circuit 432 may include a fourth transistor T44. The fourth transistor T44 may be an N-channel MOS transistor. The fourth transistor T44 may have a gate configured to receive the second delayed input signal INDB, a drain coupled to the negative output node ON2, and a source coupled to the second common node CN2. The amplifier 400 may include the second compensation circuit 430 to change the voltage level of the negative output node ON2 based on the first input signal IN and the second delayed input signal INDB generated from the second input signal INB which is a complementary signal to the first input signal IN. The second variable resistor R42 may have substantially the same resistance value as the first variable resistor R41. The second variable capacitor C42 may have substantially the same capacitance as the first variable capacitor C41.

The equalization circuit 440 may include a variable source resistor REQ and a variable source capacitor CEQ. The variable source resistor REQ and the variable source capacitor CEQ may be coupled in parallel between the first and second common nodes CN1 and CN2. The variable source resistor REQ may have one end coupled to the first common node CN1 and the other end coupled to the second common node CN2. The variable source capacitor CEQ may have one end coupled to the first common node CN1 and the other end coupled to the second common node CN2. The gain of the amplifier 400 may be changed according to the resistance value of the variable source resistor REQ and the capacitance of the variable source capacitor CEQ. The variable source resistor REQ may have a different resistance value from the first and second variable resistors R41 and R42.

Figure 5A:
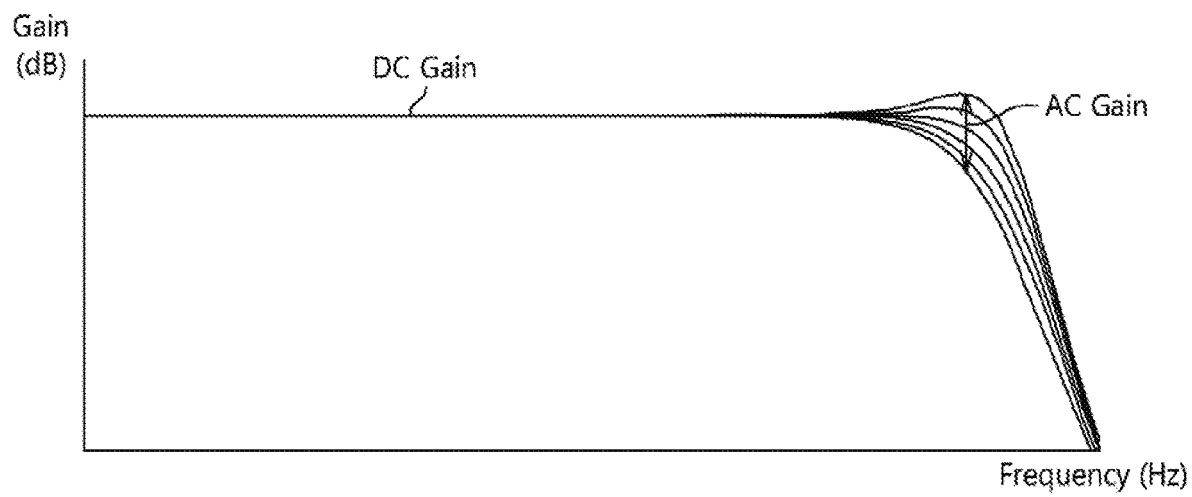
FIGS. 5A and 5B are graphs illustrating a gain change of the amplifier, depending on an impedance change of an equalization circuit.
Figure 5B:
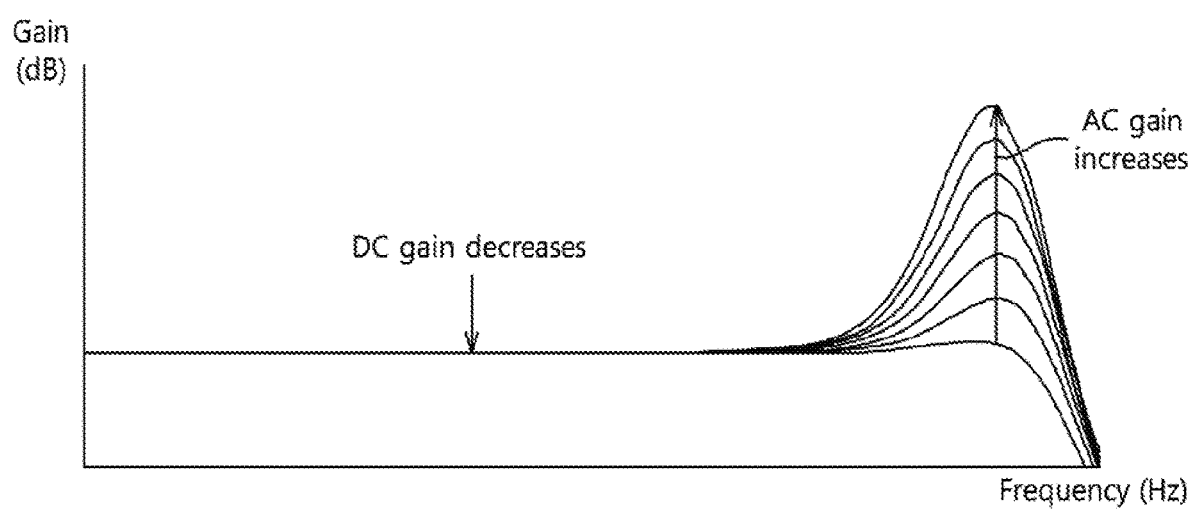
Figure 6A:
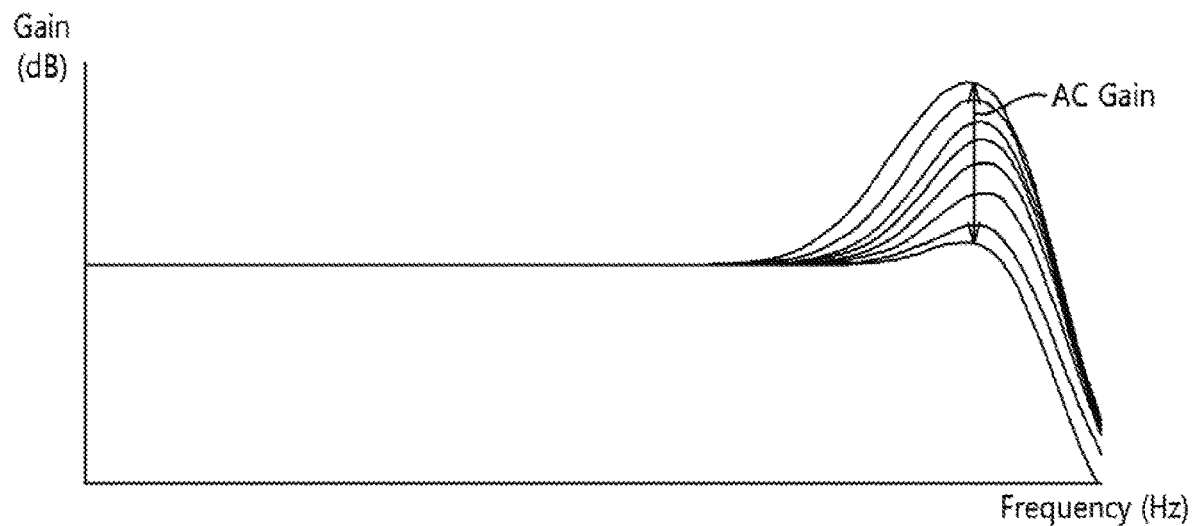
FIGS. 6A and 6B are graphs illustrating a gain change of the amplifier, depending on impedance changes of the first and second compensation circuits.
Figure 6B:
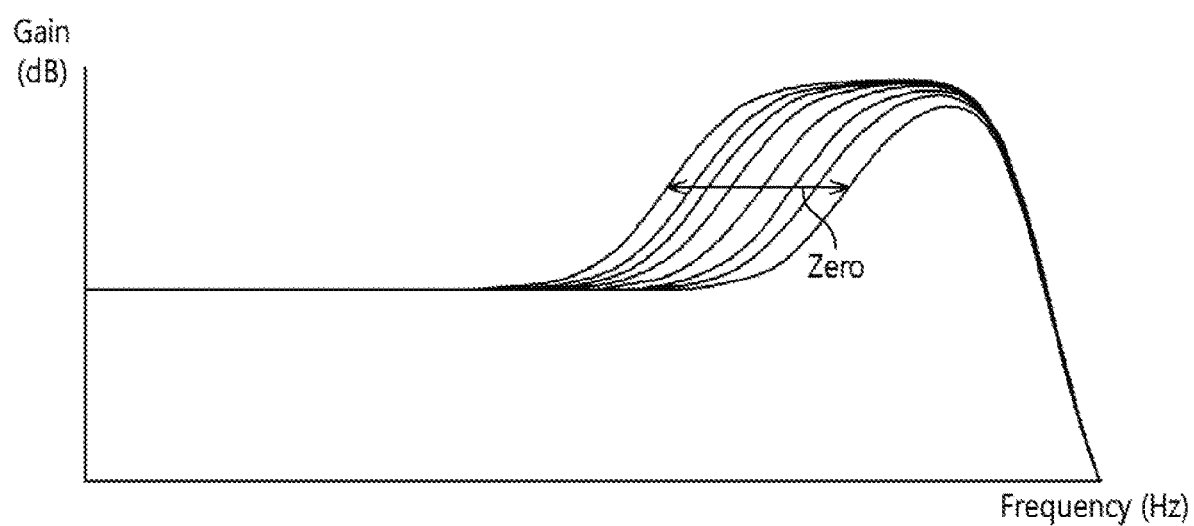

FIGS. 5A and 5B are graphs illustrating a gain change of the amplifier 400, depending on an impedance change of the equalization circuit 440. When the capacitance of the variable source capacitor CEQ is changed while the resistance value of the variable source resistor REQ is fixed, the inductive peaking of the amplifier 400 may be changed and the AC gain of the amplifier 400 may be changed, as illustrated in FIGS. 5A and 5B. When the resistance value of the variable source resistor REQ is changed while the capacitance of the variable source capacitor CEQ is fixed, the DC gain of the amplifier 400 may be changed as illustrated in FIGS. 6A and 6B. In particular, when the resistance value of the variable source resistor REQ is increased, the DC gain of the amplifier 400 may be decreased. As the DC gain is decreased, the inductive peaking of the amplifier 400 may be relatively increased, and the AC gain of the amplifier 400 may be increased.

FIGS. 6A and 6B are graphs illustrating a gain change of the amplifier 400, depending on impedance changes of the first and second compensation circuits 420 and 430. When the resistance values of the first and second variable resistors R41 and R42 are changed while the resistance value of the variable source resistor REQ, the capacitance of the variable source capacitor CEQ and the capacitances of the first and second variable capacitors C41 and C42 are fixed, the magnitude of the inductive peaking may be changed, and the AC gain of the amplifier 400 may be changed, as illustrated in FIG. 6A. For example, when the resistance values of the first and second variable resistors R41 and R42 are increased, the AC gain of the amplifier 400 may be increased. When the resistance value of the variable source resistor REQ is adjusted as described with reference to FIG. 5B, the AC gain of the amplifier 400 may be increased, but the DC gain of the amplifier 400 may be deceased. However, when the resistance values of the first and second variable resistors R41 and R42 are changed, only the AC gain may be adjusted without a decrease in the DC gain. When the capacitances of the first and second variable capacitors C41 and C42 are changed while the resistance value of the variable source resistor REQ, the capacitance of the variable source capacitor CEQ and the resistance values of the first and second variable resistors R41 and R42 are fixed, the frequency at which the AC gain starts to occur may be changed as illustrated in FIG. 6B. That is, the zero point may be changed in various frequency ranges. For example, when the capacitances of the first and second variable capacitors C41 and C42 are increased, the zero point may be moved toward a low frequency. When the zero point is adjusted, the characteristic of a channel through which the first input signal IN and/or the second input signal INB are transmitted may be matched with the characteristic of the amplifier 400. Therefore, the gain of the amplifier 400 may be optimized to efficiently compensate for a loss in the channel.

Figure 7:
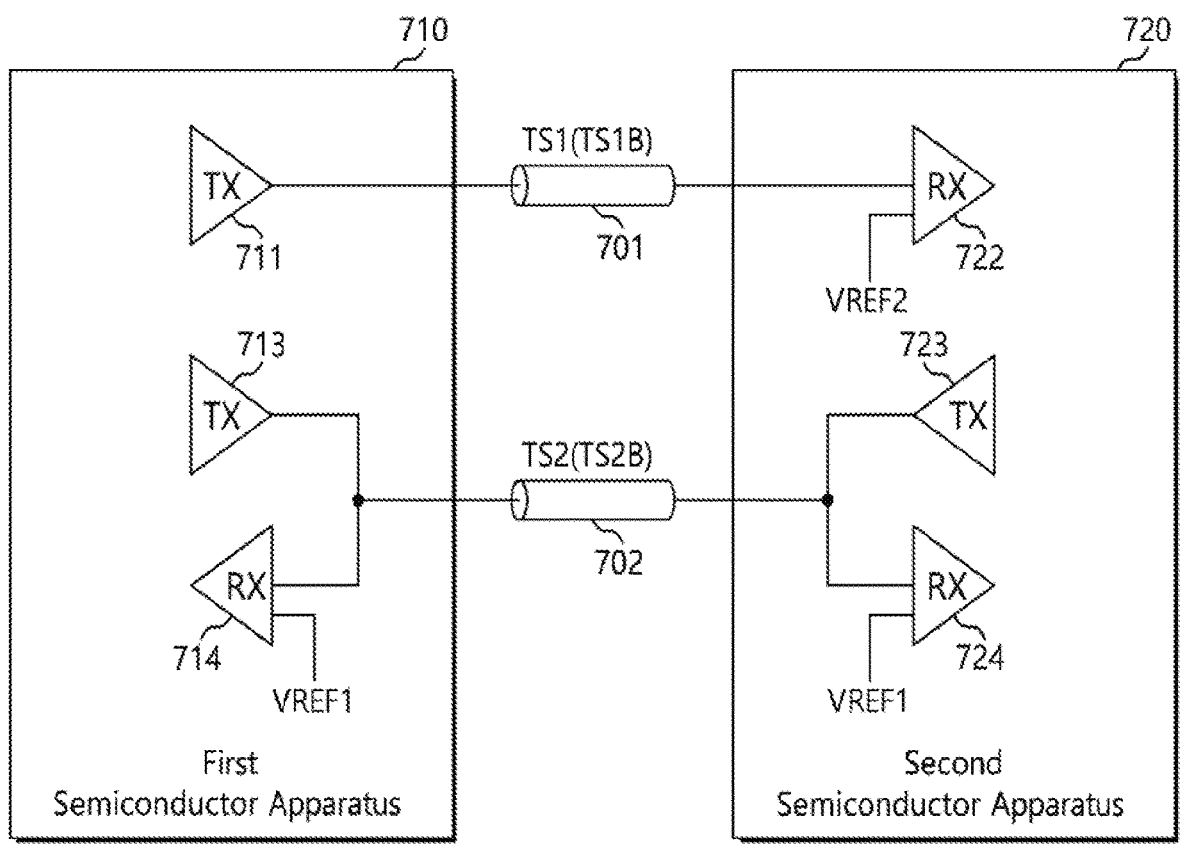
FIG. 7 is a diagram illustrating a configuration of a semiconductor system in accordance with an embodiment.

FIG. 7 illustrates a configuration of a semiconductor system 700 in accordance with an embodiment. In FIG. 7, the semiconductor system 700 may include a first semiconductor apparatus 710 and a second semiconductor apparatus 720. The first semiconductor apparatus 710 may provide various control signals required for operating the second semiconductor apparatus 720. The first semiconductor apparatus 710 may include various types of host devices. For example, the first semiconductor apparatus 710 may be s a host device such as a central processing unit (CPU), graphic processing unit (GPU), multi-media processor (MMP), digital signal processor, application processor (AP) or memory controller. The second semiconductor apparatus 720 may be a memory device, for example, and the memory device may include a volatile memory and a nonvolatile memory. The volatile memory may include an SRAM (Static RAM), DRAM (Dynamic RAM) and SDRAM (Synchronous DRAM), and the nonvolatile memory may include a ROM (Read Only Memory), PROM (Programmable ROM), EEPROM (Electrically Erasable and Programmable ROM), EPROM (Electrically Programmable ROM), flash memory, PRAM (Phase change RAM), MRAM (Magnetic RAM), RRAM (Resistive RAM), FRAM (Ferroelectric RAM) and the like.

The second semiconductor apparatus 720 may be coupled to the first semiconductor apparatus 710 through first and second buses 701 and 702. The first and second buses 701 and 702 may be signal transmission paths, links or channels for transmitting signals. The first bus 701 may be a unidirectional bus. The first semiconductor apparatus 710 may transmit a first signal TS1 to the second semiconductor apparatus 720 through the first bus 701, and the second semiconductor apparatus 720 may be coupled to the first bus 701 to receive the first signal TS1 transmitted from the first semiconductor apparatus 710. The first signal TS1 may include control signals such as a command signal, clock signal and address signal, for example. The second bus 702 may be a bidirectional bus. The first semiconductor apparatus 710 may transmit a second signal TS2 to the second semiconductor apparatus 720 through the second bus 702, or receive the second signal TS2 transmitted from the second semiconductor apparatus 720 through the second bus 702.

The second semiconductor apparatus 720 may transmit the second signal TS2 to the first semiconductor apparatus 710 through the second bus 702, or receive the second signal TS2 transmitted from the first semiconductor apparatus 710 through the second bus 702. The second signal TS2 may be data, for example. In an embodiment, the first and second signals TS1 and TS2 may be transmitted as differential signal pairs with complementary signals TS1B and TS2B through the first and second buses 701 and 702, respectively. In an embodiment, the first and second signals TS1 and TS2 may be transmitted as single-ended signals through the first and second buses 701 and 702, respectively.

The first semiconductor apparatus 710 may include a first transmitting (TX) circuit 711, a second transmitting circuit 713 and a receiving (RX) circuit 714. The first transmitting circuit 711 may be coupled to the first bus 701, and drive the first bus 701 to transmit the first signal TS1 to the second semiconductor apparatus 720, based on an internal signal of the first semiconductor apparatus 710. The second transmitting circuit 713 may be coupled to the second bus 702, and drive the second bus 702 to transmit the second signal TS2 to the second semiconductor apparatus 720, based on the internal signal of the first semiconductor apparatus 710. The receiving circuit 714 may be coupled to the second bus 702, and receive the second signal TS2 transmitted from the second semiconductor apparatus 720 through the second bus 702. The receiving circuit 714 may generate an internal signal used in the first semiconductor apparatus 710 by differentially amplifying the second signal TS2 transmitted through the second bus 702. When a differential signal pair is transmitted through the second bus 702, the receiving circuit 714 may generate the internal signal by differentially amplifying the second signal TS2 and the complementary signal TS2B of the second signal TS2. When a single-ended signal is transmitted through the second bus 702, the receiving circuit 714 may generate the internal signal by differentially amplifying the second signal TS2 and a first reference voltage VREF1. The first reference voltage VREF1 may have a voltage level corresponding to the middle of the range in which the second signal TS2 swings. The receiving circuit 714 may include any one of the amplifiers 100 and 400 illustrated in FIGS. 1 and 4.

The second semiconductor apparatus 720 may include a first receiving (RX) circuit 722, a transmitting (TX) circuit 723 and a second receiving circuit 724. The first receiving circuit 722 may be coupled to the first bus 701, and receive the first signal TS1 transmitted from the first semiconductor apparatus 710 through the first bus 701. The first receiving circuit 722 may generate an internal signal used in the second semiconductor apparatus 720 by differentially amplifying the first signal TS1 transmitted through the first bus 701. When a differential signal pair is transmitted through the first bus 701, the first receiving circuit 722 may generate the internal signal by differentially amplifying the first signal TS1 and the complementary signal TS1B of the first signal TS1. When a single-ended signal is transmitted through the first bus 701, the first receiving circuit 722 may generate the internal signal by differentially amplifying the first signal TS1 and a second reference voltage VREF2. The second reference voltage VREF2 may have a voltage level corresponding to the middle of the range in which the first signal TS1 swings. The transmitting circuit 723 may be coupled to the second bus 702, and drive the second bus 702 to transmit the second signal TS2 to the first semiconductor apparatus 710, based on the internal signal of the second semiconductor apparatus 720. The second receiving circuit 724 may be coupled to the second bus 702, and receive the second signal TS2 transmitted from the first semiconductor apparatus 710 through the second bus 702. The second receiving circuit 724 may generate an internal signal used in the second semiconductor apparatus 720 by differentially amplifying the second signal TS2 transmitted through the second bus 702. When a differential signal pair is transmitted through the second bus 702, the second receiving circuit 724 may generate the internal signal by differentially amplifying the second signal TS2 and the complementary signal TS2B of the second signal TS2. When a single-ended signal is transmitted through the second bus 702, the second receiving circuit 724 may generate the internal signal by differentially amplifying the second signal TS2 and the first reference voltage VREF1. The first and second receiving circuits 722 and 724 may include any one of the amplifiers 100 and 400 illustrated in FIGS. 1 and 4.

Figure 8:
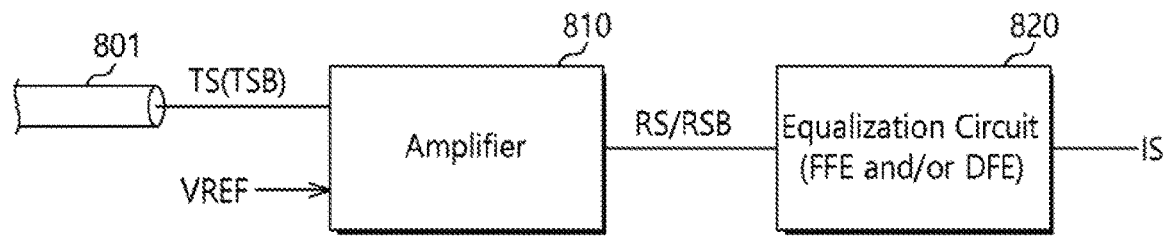
FIG. 8 illustrates the configuration of a receiving circuit in accordance with an embodiment.

FIG. 8 illustrates a configuration of a receiving circuit 800 in accordance with an embodiment. The receiving circuit 800 may be coupled to an external bus 801 or a channel, and receive a transmit (Tx) signal TS transmitted through the external bus 801. The receiving circuit 800 may generate an internal signal IS from the Tx signal TS. The Tx signal TS may have inter-symbol interference (ISI) due to a high frequency loss, reflection or cross-talk of the external bus 801 or the channel. Thus, a previously transmitted signal may cause precursor interference with a signal to be subsequently transmitted. The receiving circuit 800 may include an amplifier 810 and an equalization circuit 820 in order to minimize the precursor interference.

The amplifier 810 may be coupled to the external bus 801, and receive the Tx signal TS transmitted through the external bus 801. The amplifier 810 may generate a pair of receive (Rx) signals RS and RSB by differentially amplifying the Tx signal TS. The Rx signal pair may include an Rx signal RS and the complementary signal RSB. The amplifier 810 may accurately amplify a level transition of the Tx signal TS by increasing an AC gain instead of decreasing a DC gain, thereby generating the Rx signal RS. The Tx signal TS may be transmitted as a differential signal pair with the complementary signal TSB, and transmitted as a single-ended signal. The amplifier 810 may generate the Rx signal RS by differentially amplifying the Tx signal TS and the complementary signal TSB, and generate the Rx signal RS by differentially amplifying the Tx signal TS transmitted as the single-ended signal and the reference voltage VREF. The amplifier 810 may be a CTLE (Continuous Time Linear Equalizer), and the amplifiers 100 and 400 illustrated in FIGS. 1 and 4 may be applied as the amplifier 810.

The equalization circuit 820 may receive the Rx signal pair RS and RSB, and generate the internal signal IS. The equalization circuit 820 may generate the internal signal IS by removing a precursor which may occur in the Rx signal pair RS and RSB. The equalization circuit 820 may be implemented in various manners depending on the characteristics of a semiconductor apparatus to which the receiving circuit 800 is applied. The equalization circuit 820 may include one or more of a decision feedback equalization circuit and a feed forward equalization circuit.

While various embodiments have been described above, it will be understood to those skilled in the art that the embodiments described are examples only. Accordingly, the amplifier described herein should not be limited based on the described embodiments.

What is claimed is:

1. An amplifier comprising:
a first input circuit coupled between a negative output node and a first common node, the negative output node coupled to a first supply voltage terminal, the first common node coupled to a second supply voltage terminal, and the first input circuit configured to change a voltage level of the negative output node based on a first input signal;
a second input circuit coupled between a positive output node and a second common node, the positive output node coupled to the first supply voltage terminal, the second common node coupled to the second supply voltage terminal, and the second input circuit configured to change a voltage level of the positive output node based on a second input signal;
a first compensation circuit coupled between the positive output node and the first common node, and configured to delay the first input signal to generate a first delayed input signal and change the voltage level of the positive output node based on the first delayed input signal;
a second compensation circuit coupled between the negative output node and the second common node, and configured to delay the second input signal to generate a second delayed input signal and change the voltage level of the negative output node based on the second delayed input signal; and
a source resistor coupled between the first and second common nodes.

2. The amplifier according to claim 1, wherein the first input circuit comprises a first transistor having a gate configured to receive the first input signal, a drain coupled to the negative output node, and a source coupled to the first common node.

3. The amplifier according to claim 2, wherein the second input circuit comprises a second transistor having a gate configured to receive the second input signal, a drain coupled to the positive output node, and a source coupled to the second common node.

4. The amplifier according to claim 1, wherein the first compensation circuit comprises:
a first delay circuit configured to generate the first delayed input signal by delaying the first input signal; and
a third input circuit configured to change the voltage level of the positive output node based on the first delayed input signal.

5. The amplifier according to claim 1, wherein the first compensation circuit comprises:
a first resistor configured to receive the first input signal through one end thereof;
a first capacitor having one end coupled to the other end of the first resistor and the other end coupled to the second supply voltage terminal; and
a third transistor having a gate coupled to the other end of the first resistor, a drain coupled to the positive output node, and a source coupled to the first common node.

6. The amplifier according to claim 1, wherein the second compensation circuit comprises:
a second delay circuit configured to generate the second delayed input signal by delaying the second input signal; and
a fourth input circuit configured to change the voltage level of the negative output node based on the second delayed input signal.

7. The amplifier according to claim 1, wherein the second compensation circuit comprises:
a second resistor configured to receive the second input signal through one end thereof;
a second capacitor having one end coupled to the other end of the second resistor and the other end coupled to the second supply voltage terminal; and a fourth transistor having a gate coupled to the other end of the second resistor, a drain coupled to the negative output node, and a source coupled to the second common node.

8. The amplifier according to claim 1, further comprising:
a first load resistor coupled between the first supply voltage terminal and the positive output node; and
a second load resistor coupled between the first supply voltage terminal and the negative output node.

9. The amplifier according to claim 1, further comprising:
a first current source coupled between the first common node and the second supply voltage terminal; and
a second current source coupled between the second common node and the second supply voltage terminal.

10. The amplifier according to claim 1, further comprising a source capacitor coupled between the first and second common nodes.

11. An amplifier comprising:
a first input circuit coupled between a negative output node and a first common node, the negative output node coupled to a first supply voltage terminal, the first common node coupled to a second supply voltage terminal, and the first input circuit configured to change a voltage level of the negative output node based on a first input signal;
a second input circuit coupled between a positive output node and a second common node, the positive output node coupled to the first supply voltage terminal, the second common node coupled to the second supply voltage terminal, and the second input circuit configured to change a voltage level of the positive output node based on a second input signal;
a first delay circuit configured to generate a first delayed input signal by delaying the first input signal;
a second delay circuit configured to generate a second delayed input signal by delaying the second input signal;
a third input circuit coupled between the positive output node and the first common node, and configured to change the voltage level of the positive output node based on the first delayed input signal;
a fourth input circuit coupled between the negative output node and the second common node, and configured to change the voltage level of the negative output node based on the second delayed input signal; and
an equalization circuit coupled between the first and second common nodes.

12. The amplifier according to claim 11, wherein the first input circuit comprises a first transistor having a gate configured to receive the first input signal, a drain coupled to the negative output node, and a source coupled to the first common node.

13. The amplifier according to claim 12, wherein the second input circuit comprises a second transistor having a gate configured to receive the second input signal, a drain coupled to the positive output node, and a source coupled to the second common node.

14. The amplifier according to claim 11, wherein the first delay circuit comprises:
a first variable resistor configured to receive the first input signal through one end thereof, and output the first delayed input signal through the other end thereof; and
a first variable capacitor coupled between the other end of the first variable resistor and the second supply voltage terminal.

15. The amplifier according to claim 11, wherein the second delay circuit comprises:
a second variable resistor configured to receive the second input signal through one end thereof, and output the second delayed input signal through the other end thereof; and
a second variable capacitor coupled between the other end of the second variable resistor and the second supply voltage terminal.

16. The amplifier according to claim 11, wherein the third input circuit comprises a third transistor having a gate configured to receive the first delayed input signal, a drain coupled to the positive output node, and a source coupled to the first common node.

17. The amplifier according to claim 11, wherein the fourth input unit comprises a fourth transistor having a gate configured to receive the second delayed input signal, a drain coupled to the negative output node, and a source coupled to the second common node.

18. The amplifier according to claim 11, wherein the equalization circuit comprises:
a variable source resistor coupled between the first and second common nodes; and
a variable source capacitor coupled in parallel to the variable source resistor between the first and second common nodes.

19. The amplifier according to claim 11, further comprising:
a first load resistor coupled between the first supply voltage terminal and the positive output node; and
a second load resistor coupled between the second supply voltage terminal and the negative output node.

20. The amplifier according to claim 11, further comprising:
a first current source coupled between the first common node and the second supply voltage terminal; and
a second current source coupled between the second common node and the second supply voltage terminal.

21. An amplifier comprising:
a first input circuit coupled between a negative output node and a first common node, the negative output node coupled to a first supply voltage terminal, the first common node coupled to a second supply voltage terminal, and the first input circuit configured to change a voltage level of the negative output node based on a first input signal;
a second input circuit coupled between a positive output node and a second common node, the positive output node coupled to the first supply voltage terminal, the second common node coupled to the second supply voltage terminal, and the second input circuit configured to change a voltage level of the positive output node based on a second input signal;
a first compensation circuit coupled between the positive output node and the first common node, and configured to change the voltage level of the positive output node by receiving the first input signal;
a second compensation circuit coupled between the negative output node and the second common node, and configured to change the voltage level of the negative output node by receiving the second input signal;
a source resistor coupled between the first and second common nodes;
a first current source coupled between the first common node and the second supply voltage terminal; and
a second current source coupled between the second common node and the second supply voltage terminal.

* * * * *